US012567570B2

(12) United States Patent
Kim

(10) Patent No.: US 12,567,570 B2
(45) Date of Patent: Mar. 3, 2026

(54) APPARATUS FOR TREATING SUBSTRATE AND METHOD FOR TREATING SUBSTRATE

(71) Applicant: SEMES CO., LTD., Cheonan-si (KR)

(72) Inventor: Chang Mok Kim, Hwaseong-si (KR)

(73) Assignee: SEMES CO., LTD, Chungcheongnam-Do (KR)

( * ) Notice: Subject to any disclaimer, the term of this patent is extended or adjusted under 35 U.S.C. 154(b) by 445 days.

(21) Appl. No.: 18/068,816

(22) Filed: Dec. 20, 2022

(65) Prior Publication Data

US 2023/0207293 A1 Jun. 29, 2023

(30) Foreign Application Priority Data

Dec. 24, 2021 (KR) ........................ 10-2021-0186764
Sep. 21, 2022 (KR) ........................ 10-2022-0119120

(51) Int. Cl.
*H01J 37/32* (2006.01)

(52) U.S. Cl.
CPC .... *H01J 37/32963* (2013.01); *H01J 37/3244* (2013.01); *H01J 37/32926* (2013.01); *H01J 2237/334* (2013.01)

(58) Field of Classification Search
CPC ...................... H01J 37/32963; H01J 37/32935
USPC ........................................ 156/345.24; 216/60
See application file for complete search history.

(56) References Cited

U.S. PATENT DOCUMENTS

| | | | | |
|---|---|---|---|---|
| 2004/0027566 A1* | 2/2004 | Suzuki | ................... | G02B 23/16 |
| | | | | 356/302 |
| 2007/0095789 A1* | 5/2007 | Davis | ................ | H01J 37/32972 |
| | | | | 216/60 |
| 2017/0229293 A1* | 8/2017 | Park | ........................ | H01L 22/26 |

FOREIGN PATENT DOCUMENTS

| | | |
|---|---|---|
| KR | 10-2004-0092740 A | 11/2004 |
| KR | 10-2006-0133172 A | 12/2006 |
| KR | 10-2007-0081644 A | 8/2007 |
| KR | 10-2018-0014578 A | 2/2018 |

* cited by examiner

*Primary Examiner* — Parviz Hassanzadeh
(74) *Attorney, Agent, or Firm* — Harness, Dickey & Pierce, P.L.C.

(57) ABSTRACT

Disclosed is an apparatus for treating a substrate. The substrate treating apparatus may include a chamber for generating plasma in a treating space and treating a substrate using the plasma, and a measurement unit for monitoring light emitted from the plasma of the treating space, in which the measurement unit may include a light collection unit for collecting the light passing through a view port formed on one side wall of the chamber; and an optical cable having a connection terminal fastened to the light collection unit formed at one end to transmit the light, in which a measurement member capable of measuring a fastening length between the light collection unit and the optical cable is disposed in the connection terminal.

13 Claims, 6 Drawing Sheets

APPARATUS FOR TREATING SUBSTRATE AND METHOD FOR TREATING SUBSTRATE

CROSS-REFERENCE TO RELATED APPLICATIONS

This application claims priority to and the benefit of Korean Patent Application Nos. 10-2021-0186764 and 10-2022-0119120 filed in the Korean Intellectual Property Office on Dec. 24, 2021 and Sep. 21, 2022, the entire contents of which are incorporated herein by reference.

TECHNICAL FIELD

The present invention relates to an apparatus for treating a substrate and a method for treating a substrate, and more particularly, to an apparatus and a method for treating a substrate using plasma.

BACKGROUND ART

Plasma refers to an ionized gas state composed of ions, radicals, and electrons. The plasma is generated by very high temperatures, strong electric fields, or RF electromagnetic fields. A semiconductor device manufacturing process may include an etching process of removing a thin film formed on a substrate such as a wafer using plasma. The etching process is performed when ions and/or radicals of the plasma collide with or react with the thin film on the substrate.

When the substrate is treated using plasma in the etching process, it is important to accurately detect an end point of the treating so that the substrate is not excessively etched. In general, in the process of treating the substrate using plasma, the end point of the treating is determined by analyzing characteristics of light emitted from the plasma generated in a treating space where the substrate is treated. Specifically, the end point of the treating is determined by analyzing a peak of the light emitted from the plasma.

FIG. 1 is a diagram schematically illustrating a general substrate treating apparatus. Referring to FIG. 1, a substrate treating apparatus 1000 may include a housing 1100 having a treating space therein, a support unit 1200 for supporting a substrate W in the treating space, a gas supply unit 1300 for supplying gas to the treating space, and a plasma source 1400 for generating plasma in the treating space by exciting the gas supplied to the treating space. A view port 1500 is formed on one side wall of the housing 1100. Light emitted from the plasma generated in the treating space is transmitted to a light collection unit 1600 for collecting the light by passing through the view port 1500. In addition, the light collection unit 1600 transmits a light signal to an observation unit 1700 that observes the characteristics of light. The observation unit 1700 may detect an end point of treating by analyzing the characteristics of the transmitted light.

While the substrate W is treated using plasma, various impurities B such as particles are generated in the treating space. The impurities B may be deposited while floating in the treating space to be attached to the view port 1500. In this case, the light emitted from the plasma does not pass through the view port 1500 and the light transmitted to the light collection unit 1600 is reduced. As a result, the observation unit 1700 cannot accurately analyze the characteristics of light.

In addition, when maintenance of the substrate treating apparatus 1000 is performed after treating the substrate W, various types of cables and the like are attached and detached. For example, in the process of performing the maintenance, an optical cable 1800 connecting the light collection unit 1600 and the observation unit 1700 to transmit the light signal may be detached. Depending on the extent to which the optical cable 1800 is fastened to the light collection unit 1600, the intensity of the light signal transmitted to the observation unit 1700 varies. Accordingly, when an operator reconnects the optical cable 1800 to the light collection unit 1600 after performing the maintenance, the degree of fastening before the maintenance may be different from the degree of fastening after the maintenance. Since the strength of the light signal transmitted to the observation unit 1700 varies each time after performing maintenance, it is difficult for the observation unit 1700 to accurately detect the end point of treating by analyzing the light signal.

SUMMARY OF THE INVENTION

An object of the present invention is to provide a substrate treating apparatus and a substrate treating method capable of uniformly treating a substrate.

Another object of the present invention is to provide a substrate treating apparatus and a substrate treating method capable of accurately detecting an end point of treating when treating a substrate using plasma.

Yet another object of the present invention is to provide a substrate treating apparatus and a substrate treating method capable of accurately analyzing characteristics of light emitted from plasma.

Still another object of the present invention is to provide a substrate treating apparatus and a substrate treating method capable of accurately analyzing characteristics of light emitted from plasma, even if impurities are deposited in a view port while treating a substrate using plasma.

The effects of the present invention are not limited to the aforementioned effect, and other effects, which are not mentioned above, will be apparent to a person having ordinary skill in the art from the following disclosure.

An exemplary embodiment of the present invention provides an apparatus for treating a substrate. The substrate treating apparatus may include a chamber for generating plasma in a treating space and treating a substrate using the plasma; and a measurement unit for monitoring light emitted from the plasma of the treating space, in which the measurement unit may include a light collection unit for collecting the light passing through a view port formed on one side wall of the chamber; and an optical cable having a connection terminal fastened to the light collection unit formed at one end to transmit the light, in which a measurement member capable of measuring a fastening length between the light collection unit and the optical cable is disposed in the connection terminal.

According to the exemplary embodiment, the measurement member may include a scale indicated along a longitudinal direction of the optical cable.

According to the exemplary embodiment, the measurement unit may further include an analysis unit that is connected to the other end of the optical cable to analyze the light transmitted from the light collection unit and analyzes peak data of the light to detect an end point of the treating.

According to the exemplary embodiment, the peak data may be changed according to the fastening length.

According to the exemplary embodiment, the fastening length and the peak data may be proportional to each other.

According to the exemplary embodiment, the operator may collect the peak data according to the fastening length and record the collected peak data as standardized data while performing the treating.

According to the exemplary embodiment, the operator may change the fastening length so that the currently detected peak data is calibrated as normal peak data in a normal state based on the standardized data.

According to the exemplary embodiment, the connection terminal may have the same longitudinal direction as the longitudinal direction of the optical cable and be fastened to one wall of the light collection unit, and the scale may be indicated from one end to the other end of the connection terminal.

According to the exemplary embodiment, the measurement member may include a distance sensor that is provided on one side of the connection terminal and measures a distance to the light collection unit to which the connection terminal is connected.

According to the exemplary embodiment, the chamber may further include a support unit for supporting the substrate in the treating space; a gas supply unit for supplying gas to the treating space; and a plasma source for exciting the gas.

Another exemplary embodiment of the present invention provides a substrate treating method for treating a substrate by generating plasma in a treating space in a chamber. The substrate treating method may include analyzing peak data of light emitted from plasma generated in the treating space while treating the substrate in the treating space to detect an end point of the treating, in which the peak data may be detected according to a fastening length by measuring the fastening length between a light collection unit for collecting the light and an optical cable fastened to the light collection unit.

According to the exemplary embodiment, the peak data may be changed according to the fastening length.

According to the exemplary embodiment, the fastening length and the peak data may be proportional to each other.

According to the exemplary embodiment, the operator may collect the peak data according to the fastening length and record the collected peak data as standardized data while performing the treating.

According to the exemplary embodiment, the peak data may be changed while performing the treating, and the operator may change the fastening length based on the standardized data to calibrate the peak data changed while performing the treating to normal peak data in a normal state.

According to the exemplary embodiment, the peak data may be changed by impurities deposited in a view port through which light in the treating space passes.

According to the exemplary embodiment, the peak data may be changed after maintenance of the chamber after performing the treating.

Yet another exemplary embodiment of the present invention provides an apparatus for treating a substrate. The substrate treating apparatus may include a chamber having a view port and a treating space therein; a support unit for supporting the substrate in the treating space; a gas supply unit for supplying gas to the treating space; a plasma source for generating plasma by exciting the gas; and a measurement unit for monitoring light emitting from the plasma, in which the measurement unit may include a light collection unit for collecting the light passing through the view port; an analysis unit for detecting an end point of the treating by analyzing peak data of the light transmitted from the light collection unit; and an optical cable connected to the light collection unit and the analysis unit, respectively, to transmit the light from the light collection unit to the analysis unit, in which a connection terminal is formed at one end of the optical cable fastened with the light collection unit, and a measurement member capable of measuring a fastening length between the light collection unit and the optical cable is disposed in the connection terminal.

According to the exemplary embodiment, the measurement member may include a scale indicated on the connection terminal along the longitudinal direction of the connection terminal, and the connection terminal may be fastened to one side wall of the light collection unit.

According to the exemplary embodiment, the peak data may be changed according to the fastening length, the operator may collect the peak data according to the fastening length and record the collected peak data as standardized data while performing the treating, and the operator may change the fastening length so that the currently detected peak data is calibrated as normal peak data in a normal state based on the standardized data.

According to the exemplary embodiment of the present invention, it is possible to uniformly treat the substrate.

Further, according to the exemplary embodiment of the present invention, it is possible to accurately detect an end point of treating when treating a substrate using plasma.

Further, according to the exemplary embodiment of the present invention, it is possible to accurately analyze characteristics of light emitted from plasma.

Further, according to the exemplary embodiment of the present invention, it is possible to accurately analyze characteristics of light emitted from plasma, even if impurities are deposited in a view port while treating a substrate using plasma.

Further, according to the exemplary embodiment of the present invention, it is possible to accurately analyze characteristics of light even after performing the maintenance by standardizing peak data of light according to a coupling length between an optical cable and a measurement unit while treating the substrate using plasma.

The effect of the present invention is not limited to the foregoing effects, and non-mentioned effects will be clearly understood by those skilled in the art from the present specification and the accompanying drawings.

DETAILED DESCRIPTION

Figure 1:
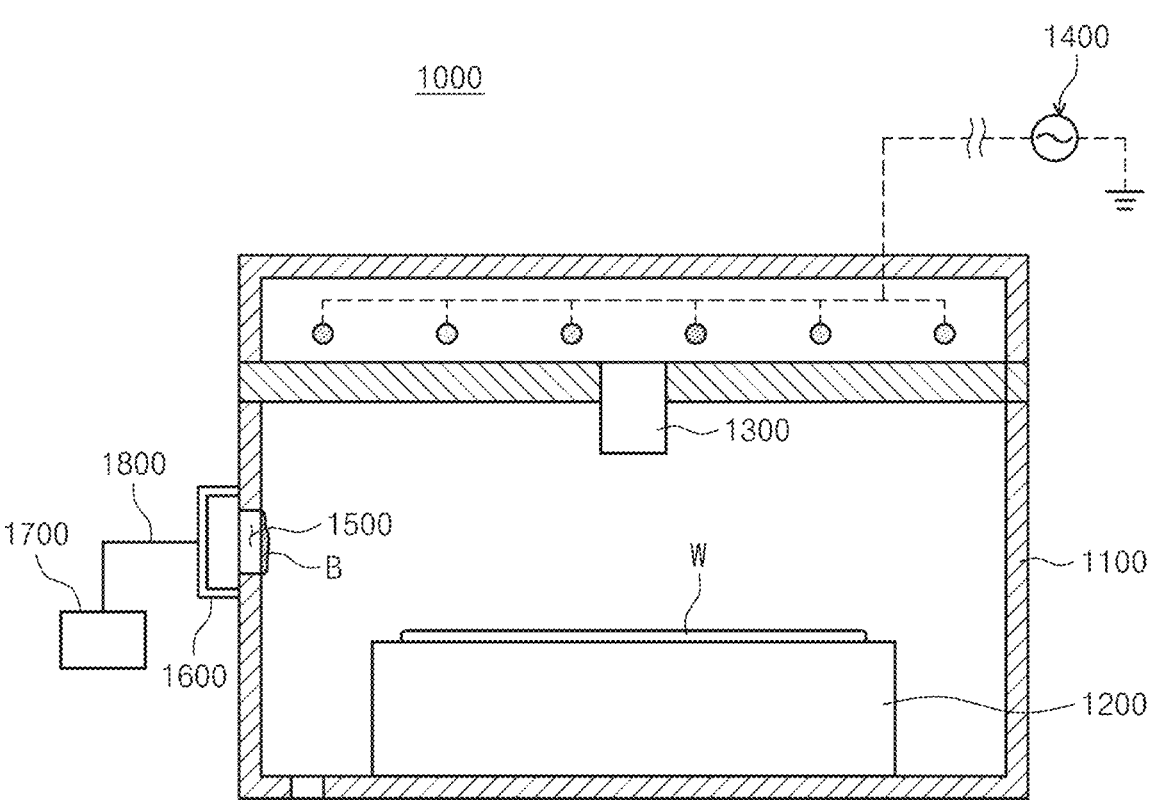
FIG. 1 is a diagram schematically illustrating a general substrate treating apparatus.

Hereinafter, exemplary embodiments of the present invention will be described in more detail with reference to the accompanying drawings. Exemplary embodiments of the present invention may be modified in various forms and should not be construed that the scope of the present invention is limited to exemplary embodiments to be described below. The exemplary embodiments will be provided for more completely explaining the present invention to those skilled in the art. Therefore, shapes, and the like of components in the drawings are exaggerated to emphasize a more clear description.

Terms, such as first and second, are used for describing various constituent elements, but the constituent elements are not limited by the terms. The terms are used only for distinguishing one component from the other component. For example, without departing from the scope of the invention, a first constituent element may be named as a second constituent element, and similarly a second constituent element may be named as a first constituent element.

Hereinafter, an exemplary embodiment of the present invention will be described in detail with reference to FIGS. 2 to 8.

Figure 2:
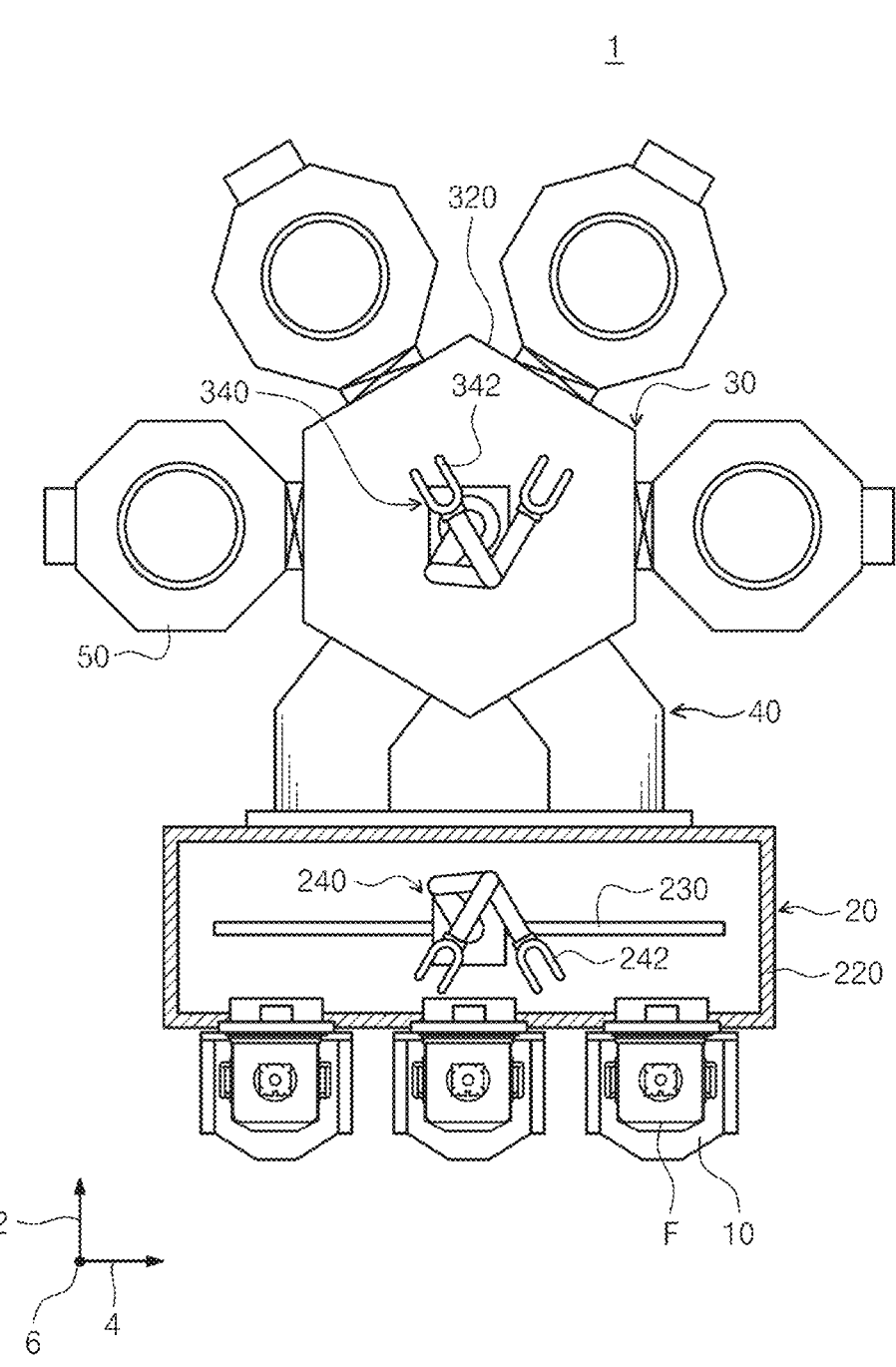
FIG. 2 is a diagram schematically illustrating a substrate treating apparatus according to an exemplary embodiment of the present invention.

FIG. 2 is a diagram schematically illustrating a substrate treating apparatus according to an exemplary embodiment of the present invention. Referring to FIG. 2, a substrate treating apparatus 1 according to an exemplary embodiment of the present invention includes a load port 10, a normal pressure transfer module 20, a vacuum transfer module 30, a load lock chamber 40, and a process chamber 50.

The load port 10 may be disposed on one side of the normal pressure transfer module 20 to be described below. At least one load port 10 may be provided. The number of load ports 10 may increase or decrease according to process efficiency, footprint conditions, and the like. A container F according to the exemplary embodiment of the present invention may be placed in the load port 10.

The container F may be loaded or unloaded on or from the load port 10 by a transfer means (not illustrated) such as an overhead transfer (OHT), an overhead conveyor, or an automatic guided vehicle or by an operator. The container F may include various types of containers according to a type of article to be accommodated. For example, as the container F, a sealed container such as a front opening unified pod (FOUP) may be used.

The normal pressure transfer module 20 and the vacuum transfer module 30 may be disposed along a first direction 2. Hereinafter, when viewed from the top, a direction perpendicular to the first direction 2 is defined as a second direction 4. In addition, a direction perpendicular to a plane including both the first direction 2 and the second direction 4 is defined as a third direction 6. For example, the third direction 6 may mean a direction perpendicular to the ground.

The normal pressure transfer module 20 may transfer the substrate W between the container F and the load lock chamber 40 to be described below. For example, the normal pressure transfer module 20 may carry out the substrate W from the container F to transfer the substrate W to the load lock chamber 40, or carry out the substrate W from the load lock chamber 40 to transfer the substrate W to the container F.

The normal pressure transfer module 20 may include a transfer frame 220 and a first transfer robot 240. The transfer frame 220 may be disposed between the load port 10 and the load lock chamber 40. The load port 10 may be connected to the transfer frame 220. The inside of the transfer frame 220 may be maintained in an atmospheric pressure atmosphere.

A transfer rail 230 and the first transfer robot 240 are disposed on the transfer frame 220. A longitudinal direction of the transfer rail 230 and a longitudinal direction of the transfer frame 220 may be horizontal with each other. For example, the longitudinal direction of the transfer rail 230 may be formed along the second direction 4. The first transfer robot 240 may be located on the transfer rail 230.

The first transfer robot 240 transfers the substrate W. The first transfer robot 240 may transfer the substrate W between the container F seated in the load port 10 and the load lock chamber 40 to be described below. The first transfer robot 240 may move forward and backward in the second direction 4 along the transfer rail 230. The first transfer robot 240 may move in a vertical direction (e.g., the third direction 6). The first transfer robot 240 has a first transfer hand 242 that moves forward and backward, or rotates on a horizontal plane. At least one first transfer hand 242 may be provided. The substrate W is disposed on the first transfer hand 242. A plurality of first transfer hands 242 may be spaced apart from each other in the third direction 6.

The vacuum transfer module 30 may be disposed between the load lock chamber 40 and the process chamber 50 to be described below. The vacuum transfer module 30 may include a transfer chamber 320 and a second transfer robot 340.

The inside of the transfer chamber 320 may be maintained in a vacuum pressure atmosphere. The second transfer robot 340 is disposed in the transfer chamber 320. For example, the second transfer robot 340 may be disposed in the center of the transfer chamber 320. The second transfer robot 340 transfers the substrate W between the load lock chamber 40 and the process chamber 50 to be described below. In addition, the second transfer robot 340 transfers the substrate W between the process chambers 50. The second transfer robot 340 may move in a vertical direction. The second transfer robot 340 has a second transfer hand 342 that moves forward and backward, or rotates on a horizontal plane. At least one second transfer hand 342 may be provided. The substrate W is disposed on the second transfer hand 342. A plurality of second transfer hands 342 may be spaced apart from each other in the third direction 6.

At least one process chamber 50 to be described below is connected to the transfer chamber 320. According to the exemplary embodiment, the transfer chamber 320 may be provided in a polygonal shape. The load lock chamber 40 and the process chamber 50 to be described below may be disposed around the transfer chamber 320. Unlike those described above, the shape of the transfer chamber 320 and the number of process chambers 50 may be variously modified according to user needs or process requirements.

The load lock chamber 40 may be disposed between the transfer frame 220 and the transfer chamber 320. The load lock chamber 40 has a buffer space in which the substrate W is exchanged between the transfer frame 220 and the transfer chamber 320. For example, the substrate W in which a predetermined process has been completed in the process chamber 50 may temporarily stay in the load lock chamber 40. In addition, the substrate W, which is carried out from the container F and will be subjected to a predetermined process, may temporarily stay in the load lock chamber 40.

As described above, the inside of the transfer frame 220 may be maintained in an atmospheric pressure atmosphere, and the inside of the transfer chamber 320 may be maintained in a vacuum pressure atmosphere. The load lock chamber 40 may be disposed between the transfer frame 220 and the transfer chamber 320 so that the inner atmosphere may be switched between the atmospheric pressure and the vacuum pressure.

A plurality of process chambers 50 may be provided. The process chamber 50 may be a chamber which performs a predetermined process on the substrate W. According to the exemplary embodiment of the present invention, the process chamber 50 may treat the substrate W using plasma. For example, the process chamber 50 may be a chamber which performs an etching process for removing a thin film on the substrate W using plasma, a deposition process of forming a thin film on the substrate W, or a dry cleaning process. In addition, the process chamber 50 may be a chamber which performs an atomic layer deposition (ALD) process of alternately supplying different types of gases and depositing an atomic layer on the substrate W using plasma. However, the present invention is not limited thereto, and the plasma treating process performed by the process chamber 50 may be variously modified into known plasma treating processes.

Figure 3:
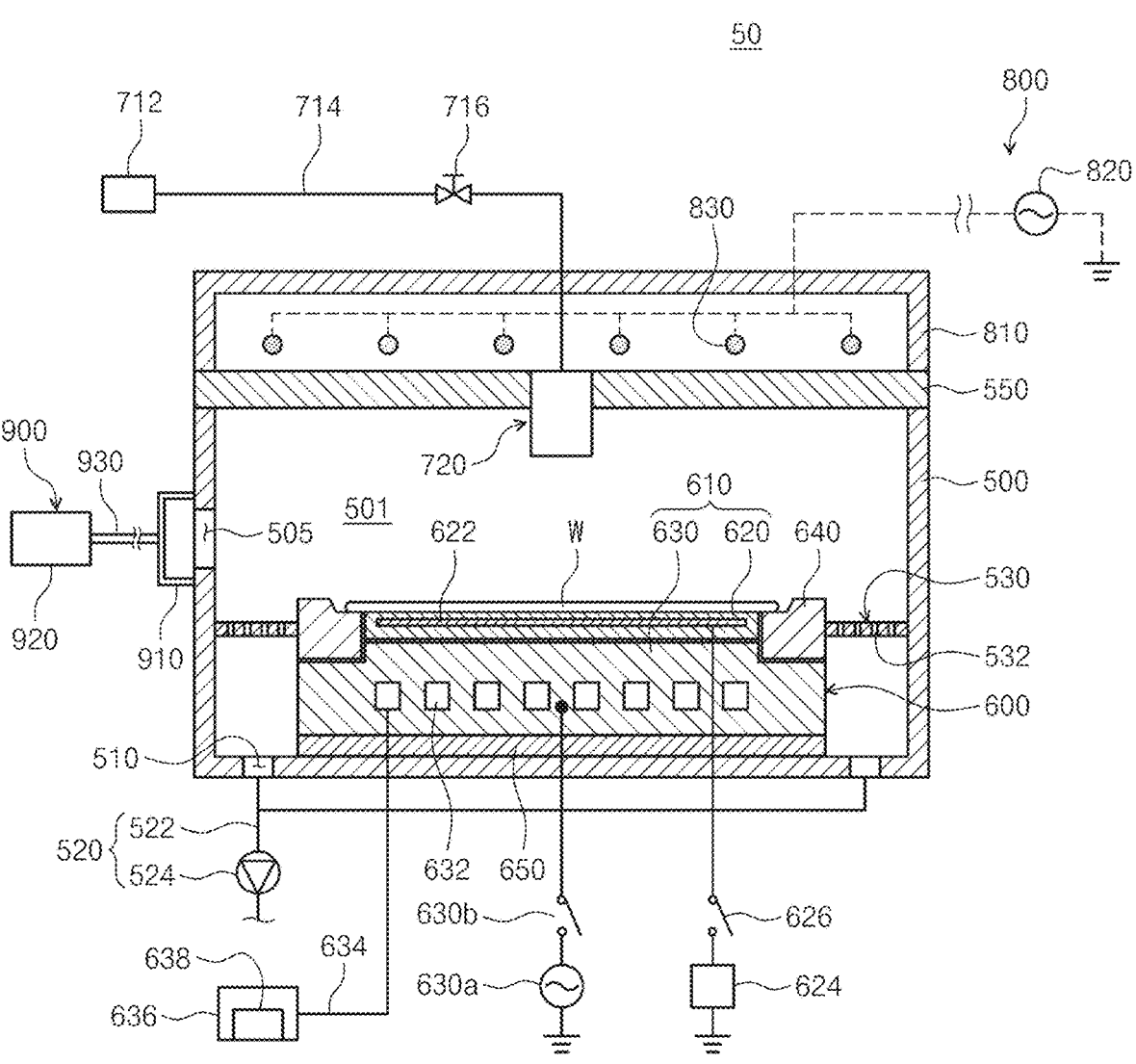
FIG. 3 is a diagram schematically illustrating a process chamber according to the exemplary embodiment of FIG. 2.

FIG. 3 is a diagram schematically illustrating a chamber according to the exemplary embodiment of FIG. 2. Referring to FIG. 3, the process chamber 50 may include a housing 500, a support unit 600, a gas supply unit 700, a plasma source 800, and a measurement unit 900.

The housing 500 may be a chamber having a space therein. Accordingly, the housing 500 may be referred to as a chamber. An inner space of the housing 500 may function as a treating space 501 in which the substrate W is treated. The housing 500 may have a shape with an opened upper surface. For example, the housing 500 may have a cylindrical shape with an opened upper surface. The opened upper surface of the housing 500 may be sealed by a cover 550 to be described below. The treating space 501 may be maintained in a substantially vacuum atmosphere while treating the substrate W. The material of the housing 500 may include aluminum. In addition, the housing 500 may be grounded.

According to the exemplary embodiment, a liner (not illustrated) may be disposed inside the housing 500. The liner (not illustrated) may have a cylindrical shape with opened upper and lower surfaces. The liner (not illustrated) may be disposed to be in surface contact with an inner wall of the housing 500. The liner (not illustrated) may minimize damage to the inner wall of the housing 500 by plasma. Unlike the aforementioned embodiment, the liner (not illustrated) may not be provided inside the housing 500.

An opening (not illustrated) is formed in a side wall of the housing 500. The opening (not illustrated) functions as a space in which the substrate W is carried into or carried out from the treating space 501. The opening (not illustrated) may be selectively opened and closed by a door assembly (not illustrated).

In addition, a view port 505 is formed on one side wall of the housing 500. At least one view port 505 may be formed on a side wall of the housing 500. The view port 505 may be formed at a position that does not overlap with an opening (not illustrated) formed in the side wall of the housing 500. The view port 505 is formed through the side wall of the housing 500. When viewed from the front, the view port 505 may be disposed between the cover 550 and the support unit 600 to be described below.

Light emitted from plasma generated in the treating space 501 through the view port 505 may pass through the view port 505. The light passing through the view port 505 may be transmitted to a light collection unit 910 to be described below. A detailed mechanism thereof will be described below.

An exhaust hole 510 is formed in the bottom surface of the housing 500. The exhaust hole 510 is connected with an exhaust unit 520. The exhaust unit 520 may control the pressure of the treating space 501 by exhausting the atmosphere of the treating space 501. In addition, the exhaust unit 520 may discharge process gas, impurities (byproducts), and the like existing in the treating space 501 to the outside of the treating space 501.

The exhaust unit 520 includes an exhaust line 522 and a decompression member 524. One end of the exhaust line 522 is connected to the exhaust hole 510, and the other end of the exhaust line 522 is connected to the decompression member 524. The decompression member (not illustrated) may be a known device of applying a negative pressure to the treating space 501.

An exhaust baffle 530 may be located above the exhaust hole 510 to more uniformly exhaust the treating space 501. The exhaust baffle 530 may be provided between the side wall of the housing 500 and the support unit 600 to be described below. In addition, when the liner (not illustrated) is provided inside the housing 500, the exhaust baffle 530 may be provided between the liner (not illustrated) and the support unit 600. When viewed from the top, the exhaust baffle 530 may have a substantially ring shape. At least one baffle hole 532 may be formed in the exhaust baffle 530. The baffle hole 532 may be a through hole penetrating through the upper and lower surfaces of the exhaust baffle 530. The process gas, impurities, and the like existing in the treating space 501 may be discharged through the baffle hole 532, the exhaust hole 510, and the exhaust line 522.

The cover 550 is located above the housing 500. The cover 550 seals the opened upper surface of the housing 500. According to the exemplary embodiment, the cover 550 covers the opened upper surface of the housing 500 to define a lower treating space 501. The cover 550 may be formed in a substantially plate shape. The cover 550 may be formed in a substantially plate shape. The cover 550 may include a dielectric substance window. A groove may be formed in a central portion including the center of the cover 550. The groove formed in the cover 550 may be formed stepwise. The groove formed in the central portion of the cover 550 may pass through upper and lower surfaces of the cover 550. A nozzle member 720 to be described below is inserted into the groove formed in the central portion of the cover 550.

The support unit 600 may be located in the treating space 501. According to the exemplary embodiment, the support unit 600 supports the substrate W in the treating space 501. The support unit 600 may include an electrostatic chuck ESC for adsorbing the substrate W using an electrostatic force. Alternatively, the support unit 600 may support the substrate W in various methods such as a vacuum adsorption method or a mechanical clamping method. Hereinafter, the support unit 600 including the electrostatic chuck ESC will be described as an example.

The support unit 600 may include an electrostatic chuck 610 and an insulating plate 650. The electrostatic chuck 610 supports the substrate W. The electrostatic chuck 610 may include a dielectric plate 620 and a base plate 630.

The dielectric plate 620 is located on an upper portion of the support unit 600. The substrate W is disposed on the upper surface of the dielectric plate 620. When the substrate W is placed on the upper surface of the dielectric plate 620, an edge region of the substrate W may be located outside the dielectric plate 620. According to the exemplary embodiment, the dielectric plate 620 may be formed in a disk shape. According to the exemplary embodiment, the dielectric plate 620 may have a smaller diameter than the substrate W. According to the exemplary embodiment, the dielectric plate 620 may be a dielectric substance.

An electrode 622 may be located inside the dielectric plate 620. According to the exemplary embodiment, the electrode 622 may be embedded inside the dielectric plate 620. The electrode 622 is electrically connected to the first power supply 624. The first power supply 624 may include a DC power supply. A first switch 626 may be provided in the first power supply 624. The electrode 622 may be electrically connected to or disconnected from the first power supply 624 by ON/OFF of the first switch 626. When the first switch 626 is turned on, a direct current flows in the electrode 622. An electrostatic force acts between the electrode 622 and the substrate W by the current flowing in the electrode 622. Accordingly, the substrate W is adsorbed to the dielectric plate 620 by the electrostatic force.

In addition, a heater (not illustrated) may be disposed inside the dielectric plate 620. The heater (not illustrated) disposed inside the dielectric plate 620 may be located below the electrode 622. The heater (not illustrated) may include a spiral coil. The heater (not illustrated) may transfer heat to the dielectric plate 620, and the heat transferred to the dielectric plate 620 may be transferred to the substrate W. However, unlike the aforementioned embodiment, the heater (not illustrated) may not be disposed inside the dielectric plate 620.

The base plate 630 is located below the dielectric plate 620. According to the exemplary embodiment, the base plate 630 may have a disk shape. The upper surface of the base plate 630 may be formed to be stepped so that the central region thereof is located relatively higher than the edge region. A central region of the upper surface of the base plate 630 may have an area corresponding to the lower surface of the dielectric plate 620. The central region of the upper surface of the base plate 630 may be bonded to the lower surface of the dielectric plate 620 by an adhesive layer (not illustrated). A ring member 640 to be described below may be located above the edge region of the upper surface of the base plate 630.

The base plate 630 may include a material having excellent heat transfer performance and electric transfer performance. According to the exemplary embodiment, the base plate 630 may include a metal plate. According to the exemplary embodiment, the entire base plate 630 may be made of a metallic material. For example, the material of the base plate 630 may include aluminum.

The base plate 630 may be electrically connected to a second power supply 630*a*. A second switch 630*b* may be provided in the second power supply 630*a*. The base plate 630 may be electrically connected to or disconnected from the second power supply 630*a* by ON/OFF of the second switch 630*b*. The second power supply 630*a* may be a low-frequency power supply for generating low-frequency power. The second power supply 630*a* may apply the low-frequency power to the base plate 630. The base plate 630 may receive the low-frequency power from the second power supply 630*a* to improve the fluidity of plasma formed in the treating space 501. According to the exemplary embodiment, the base plate 630 may receive the low-frequency power to improve straightness or insertion of plasma generated in the treating space 501. For example, when the low-frequency power is applied to the base plate 630, the plasma present in the treating space 501 may move to the upper surface of the substrate W with straightness. However, unlike the above-described embodiment, the low-frequency power may not be applied to the base plate 630.

A cooling flow path 632 may be formed inside the base plate 630. The cooling flow path 632 functions as a passage through which a cooling fluid circulates. According to the exemplary embodiment, the cooling fluid may include cooling water. According to the exemplary embodiment, the cooling flow path 632 may be formed of a single passage. Further, the cooling flow path 632 may be formed in a spiral shape.

Optionally, a plurality of cooling flow paths 632 may be formed. For example, the plurality of flow paths may be formed in a ring shape having different radii while sharing the center of the base plate 630 inside the base plate 630. The plurality of flow paths may fluid-communicate with each other. In addition, the plurality of flow paths may be located at the same height as each other.

The cooling flow channel 632 is connected with a cooling fluid storage unit 636 via a cooling fluid supply line 634. A cooling fluid is stored in the cooling fluid storage unit 636. A cooler 638 may be located inside the cooling fluid storage unit 636. The cooler 638 may cool the cooling fluid stored in the cooling fluid storage unit 636 to a predetermined temperature. Unlike those described above, the cooler 638 may be provided on the cooling fluid supply line 634. The cooling fluid may circulate along the cooling flow path 632 and cool the base plate 630. The dielectric plate 620 and the substrate W may be cooled together by the cooled base plate 630. Thus, the substrate W may be maintained at a desired temperature.

Although not illustrated, a heat transfer flow path (not illustrated) may be formed inside the base plate 630. The heat transfer flow path (not illustrated) may supply a heat transfer medium to the lower surface of the substrate W. The heat transfer medium may be a fluid supplied to the lower surface of the substrate W in order to solve the temperature non-uniformity of the substrate W while the substrate W is treated using plasma. According to the exemplary embodiment, the heat transfer medium may be helium (He) gas.

The ring member 640 is disposed in the edge region of the electrostatic chuck 610. The ring member 640 has a ring shape. The ring member 640 is disposed along the circumference of the dielectric plate 620. The upper surface of the ring member 640 may be formed stepwise so that the outer portion is higher than the inner portion. An upper surface of the inner portion of the ring member 640 may be located at the same height as an upper surface of the dielectric plate 620. The upper surface of the inner portion of the ring member 640 may support a lower edge surface of the substrate W located outside the dielectric plate 620. The outer portion of the ring member 640 may surround a side portion of the substrate W. According to the exemplary embodiment, the ring member 640 may be a focus ring.

The insulating plate 650 is located below the base plate 630. The insulating plate 650 may include an insulating material. The insulating plate 650 electrically insulates the base plate 630 from the housing 500. When viewed from the top, the insulating plate 650 may be formed in a circular plate shape. Upper and lower surfaces of the insulating plate 650 may have areas corresponding to the area of the bottom surface of the base plate 630.

The gas supply unit 700 supplies gas to the treating space 501. The gas supplied to the treating space 501 by the gas supply unit 700 may be gas excited by a plasma source 800 to be described below. In addition, the gas supplied to the treating space 501 by the gas supply unit 700 may be a carrier gas. However, the present invention is not limited thereto, and the gas supplied to the treating space 501 by the gas supply unit 700 may include various types of known gases used when plasma is treated on the substrate W.

The gas supply unit 700 may include a gas source 712, a gas line 714, a gas valve 716, and a nozzle member 720.

The gas source 712 stores gas. The gas line 714 connects the gas source 712 and the nozzle member 720 to each other. According to the exemplary embodiment, one end of the gas line 714 may be connected to the gas source 712 and the other end of the gas line 714 may be connected to the nozzle member 720. The gas valve 716 may be provided in the gas line 714. The gas valve 716 may be an on/off valve. Optionally, the gas valve 716 may be a flow rate control valve.

The nozzle member 720 injects gas into the treating space 501. The nozzle member 720 may receive the gas stored in the gas source 712 through the gas line 714 and inject the supplied gas into the treating space 501. The nozzle member 720 may be provided on the cover 550. For example, the nozzle member 720 may be provided in the central portion of the cover 550. The nozzle member 720 may be inserted to a groove formed in the central portion of the cover 550. Accordingly, the nozzle member 720 may inject gas into the treating space 501 from the upper side of the treating space 501.

The plasma source 800 excites the gas supplied to the treating space 501 into a plasma state. The plasma source 800 according to the exemplary embodiment of the present invention may use an inductively coupled plasma (ICP). However, it is not limited thereto, and the plasma source 800 may be modified and used with various devices capable of generating plasma, such as capacitively coupled plasma (CCP) and microwave plasma. Hereinafter, a case in which the inductively coupled plasma (ICP) is used as the plasma source 800 will be described as an example.

The plasma source 800 may include an antenna housing 810, a plasma power supply 820, and an antenna 830. The antenna housing 810 may be formed in a substantially cylindrical shape. According to the exemplary embodiment, the antenna housing 810 may have a cylindrical shape with an opened lower portion. The antenna housing 810 may have a diameter corresponding to that of the housing 500. The antenna housing 810 may be disposed above the housing 500. Further, the antenna housing 810 may be disposed above the cover 550. According to the exemplary embodiment, the lower end of the antenna housing 810 may be detachable from the cover 550. The antenna housing 810 has an inner space. The antenna 830 to be described below is disposed in the inner space of the antenna housing 810.

The plasma power supply 820 may be located outside the process chamber 50. The plasma power supply 820 may apply high-frequency power to the antenna 830 to be described below. According to the exemplary embodiment, the plasma power supply 820 may be an RF power supply. An end of a power line to which the plasma power supply 820 is connected may be grounded. An impedance matcher (not illustrated) may be provided in the power line.

The antenna 830 may include a spiral coil wound multiple times. The coil may be disposed at a position facing the substrate W. For example, when viewed from the top, the coil may be disposed at a position overlapping with the substrate W supported by the support unit 600. The coil is connected to the plasma power supply 820 to receive power from the plasma power supply 820. According to the exemplary embodiment, the coil may receive high-frequency power from the plasma power supply 820 to induce a time-varying electric field in the treating space 501. Accordingly, the gas supplied to the treating space 501 may be excited into plasma.

Figure 4:
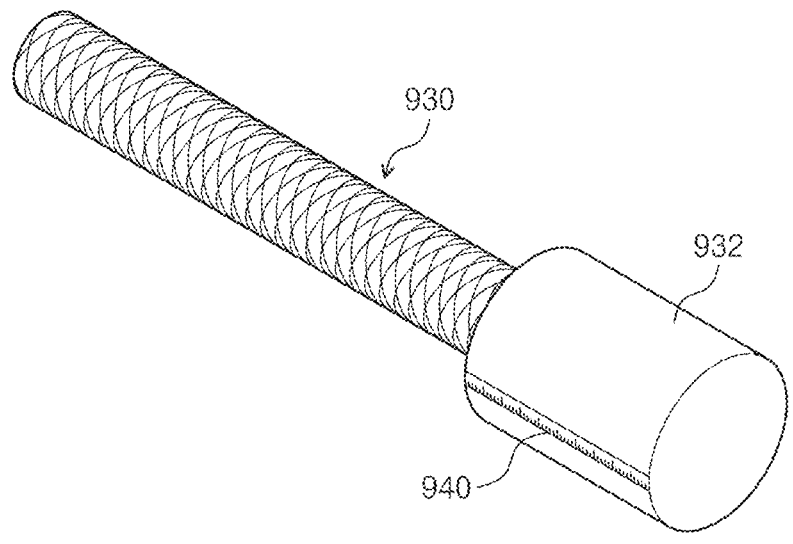
FIG. 4 is a diagram schematically illustrating a connection terminal and a measurement member according to the exemplary embodiment of FIG. 3.
Figure 5:
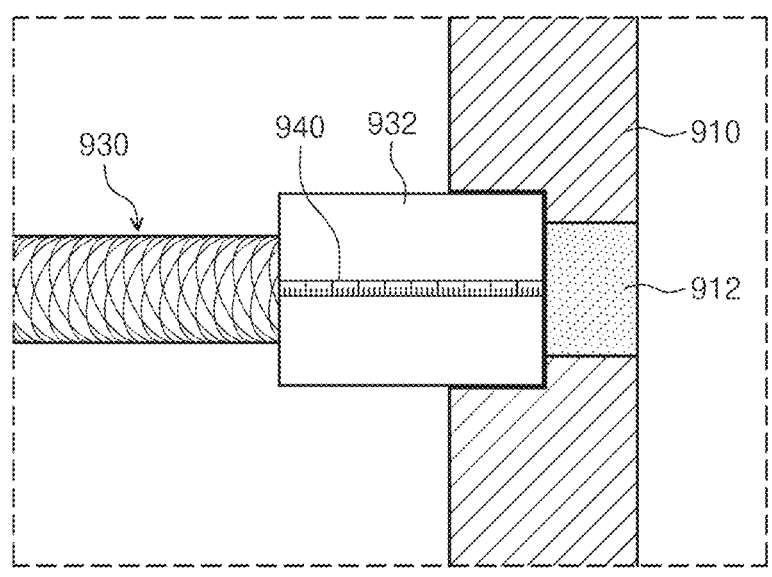
FIG. 5 is a diagram schematically illustrating a state in which the connection terminal is connected to a light collection unit according to the exemplary embodiment of FIG. 4.

FIG. 4 is a diagram schematically illustrating a connection terminal and a measurement member according to the exemplary embodiment of FIG. 3. FIG. 5 is a diagram schematically illustrating a state in which the connection terminal is connected to a light collection unit according to the exemplary embodiment of FIG. 4.

Hereinafter, the measurement unit according to the exemplary embodiment of the present invention will be described in detail with reference to FIGS. 3 to 5.

The measurement unit 900 may monitor the treating space 501. Specifically, the measurement unit 900 may monitor the light emitted from the plasma generated in the treating space 501. According to the exemplary embodiment, the measurement unit 900 may measure the characteristics of the plasma generated in the treating space 501 by monitoring and analyzing the light. For example, the measurement unit 900 may analyze the intensity of light (amount of light) and/or the wavelength of light. Using the characteristics of the plasma measured by the measurement unit 900, an operator may control a process by controlling the density, intensity, composition, etc. of the plasma generated in the treating space 501.

The detection unit 900 according to an exemplary embodiment may include a light collection unit 910, an analysis unit 920, an optical cable 930, and a measurement member 940.

The light collection unit 910 may be disposed on one side wall of the housing 500. According to the exemplary embodiment, the light collection unit 910 may be disposed at a position corresponding to the view port 505 formed on one side wall of the housing 500.

The light collection unit 910 may have a light collection space in which light is collected. A plurality of lenses (not illustrated) may be disposed inside the light collection unit 910. The light emitted from the plasma generated in the treating space 501 passes through the view port 505, the light passing through the view port 505 is transmitted to the light collection unit 910, and the transmitted light may be collected in the light collection unit 910.

In addition, a terminal 912 may be formed in the light collection unit 910. The terminal 912 may be formed on an inner wall of the light collection unit 910. In addition, a groove may be formed in the light collection unit 910. For example, a groove may be formed on an outer side wall of the light collection unit 910. A connection terminal 932 to be described below may be fastened to the groove formed in the light collection unit 910. When viewed from the front, the groove and the terminal 912 may be formed at overlapping positions with each other. Thus, the terminal 912 and the connection terminal 932 may be electrically connected to each other. The light collected by the light collection unit 910 is converted into optical data in the terminal 912, and the converted optical data may be transmitted to the connection terminal 932 connected to the terminal 912. Hereinafter, for convenience of description, the optical data will be collectively referred to as light.

The analysis unit 920 may be disposed in an outer region of the housing 500. In addition, the analysis unit 920 may be connected to the light collection unit 910. The analysis unit 920 may be connected to the light collection unit 910 via the optical cable 930 to be described below. The analysis unit 920 may receive the light collected by the light collection unit 910 and analyze the received light. That is, the analysis unit 920 may analyze light emitted from the plasma generated in the treating space 501. In addition, the analysis unit 920 may analyze light to detect an end point of treating. Specifically, the analysis unit 920 may analyze peak data from the light transmitted from the light collection unit 910. The end point of treating may be detected using the peak data analyzed by the analysis unit 920. According to the exemplary embodiment, the analysis unit 920 may be an optical emission spectrometer (OES) that measures a spectrum of light.

The optical cable 930 may include an optical fiber consisting of a plurality of strands. According to the exemplary embodiment, the optical cable may be a fiber optic cable (FOC) cable. One end of the optical cable 930 may be connected to the light collection unit 910. In addition, the other end of the optical cable 930 may be connected to the analysis unit 920. The optical cable 930 may transmit the light collected by the light collection unit 910 to the analysis unit 920.

According to the exemplary embodiment, the connection terminal 932 may be formed at one end of the optical cable 930. The connection terminal 932 may have the same longitudinal direction as the longitudinal direction of the optical cable 930. The connection terminal 932 may be fastened to the light collection unit 910. Specifically, the connection terminal 932 may be fastened to the groove formed in the light collection unit 910 described above. According to the exemplary embodiment, only a partial region of the entire area of the connection terminal 932 may be fastened to the groove formed in the light collection unit 910. The connection terminal 932 may be fastened to the light collection unit 910 to receive light collected by the light collection unit 910. The measurement member 940 may be disposed on the connection terminal 932.

The measurement member 940 may measure a fastening length between the light collection unit 910 and the optical cable 930. The measurement member 940 may include a scale. The scale may be indicated along the longitudinal direction of the optical cable 930. That is, the scale may be indicated along the longitudinal direction of the connection terminal 932. For example, the scale may be indicated from one end to the other end of the connection terminal 932.

According to the exemplary embodiment, since only a partial region of the entire area of the connection terminal 932 is fastened to the light collection unit 910, the degree of fastening between the light collection unit 910 and the optical cable 930 may be determined using the scale indicated from one end to the other end of the connection terminal 932 along the longitudinal direction of the connection terminal 932. Accordingly, the operator may determine the degree at which the optical cable 930 is fastened to the groove of the light collection unit 910 by checking the scale. That is, the operator may measure the fastening length between the optical cable 930 and the light collection unit 910 using the scale.

Hereinafter, a substrate treating method according to an exemplary embodiment of the present invention will be described. Further, a mechanism for detecting an end point of treating using the measurement unit of the present invention described above will be described in detail. Since the substrate treating method and the mechanism for detecting the end point of treating to be described below are performed by using the substrate treating apparatus according to the exemplary embodiment described with reference to FIGS. 2 to 5, hereinafter, reference numerals referred to in FIGS. 2 to 5 are used as they are.

Peak data detected by the analysis unit 920 according to the exemplary embodiment is related to the length of the optical cable 930 fastened to the light collection unit 910. For example, when the connection terminal 932 of the optical cable 930 is relatively deeply fastened to the light collection unit 910, the values of peak data detected by the analysis unit 920 increase. On the contrary, when the connection terminal 932 is relatively thinly fastened to the light collection unit 910, the values of peak data detected by the analysis unit 920 decrease. That is, the peak data values detected by the analysis unit 920 may be proportional to the fastening length between the optical cable 930 and the light collection unit 910.

In the process chamber 50 according to the exemplary embodiment, the plasma is generated in the treating space 501 to treat the substrate W. While the substrate W is treated, the operator may collect and record the peak data according to the fastening length between the optical cable 930 and the light collection unit 910. Specifically, while the substrate W is treated by generating plasma in the treating space 501, the operator may match and record the peak data detected by the analysis unit 920 according to the fastened length with the length of the connection terminal 932 formed in the optical cable 930 to the groove formed in the light collection unit 910. That is, while the substrate W is treated using the plasma, the operator may collect the peak data according to the fastening length between the optical cable 930 and the light collection unit 910 to record the collected peak data as standardized data.

In the process of treating the substrate W, predetermined thin films formed on the substrate W may be etched to generate impurities such as particles and the like in the treating space 501. In addition, the predetermined thin films formed on the substrate W may chemically react with the plasma to generate impurities in the treating space 501. In this case, the impurities may float in the treating space 501 and may be deposited and attached to the view port 505 formed on the side wall of the housing 500. When the impurities are attached or deposited on the view port 505, the light emitted from the plasma generated while treating the substrate W does not pass through the view port 505 smoothly. Accordingly, the amount of light collected by the light collection unit 910 is relatively reduced. As a result, since the amount of light transmitted to the analysis unit 920 decreases, the peak data values of the light in the analysis unit 920 may decrease. When the peak data values vary, the end point of treating on the substrate W cannot be accurately detected.

In addition, after a predetermined number of substrates or more are treated, maintenance on the process chamber 50 may be performed. For example, the maintenance may be performed on the process chamber 50 between the treating of a preceding substrate and the treating of a subsequent substrate. When performing the maintenance, the components included in the process chamber 50 may be detached. For example, when the maintenance on the process chamber 50 is performed, the connection terminal 932 of the optical cable 930 fastened to the light collection unit 910 may be separated from the light collection unit 910. After performing the maintenance, the operator fastens the connection terminal 932 to the groove formed in the light collection unit 910 again. In this case, the degree of fastening between the connection terminal 932 and the light collection unit 910 may vary depending on the operator. As described above, since the peak data values detected by the analysis unit 920 is associated with the fastening length between the optical cable 930 and the light collection unit 910, even if the impurities are not attached to the view port 505, the peak data values detected by the analysis unit 920 may vary depending on the operator. When the peak data values vary, the end point of treating on the substrate W cannot be accurately detected.

Figure 6:
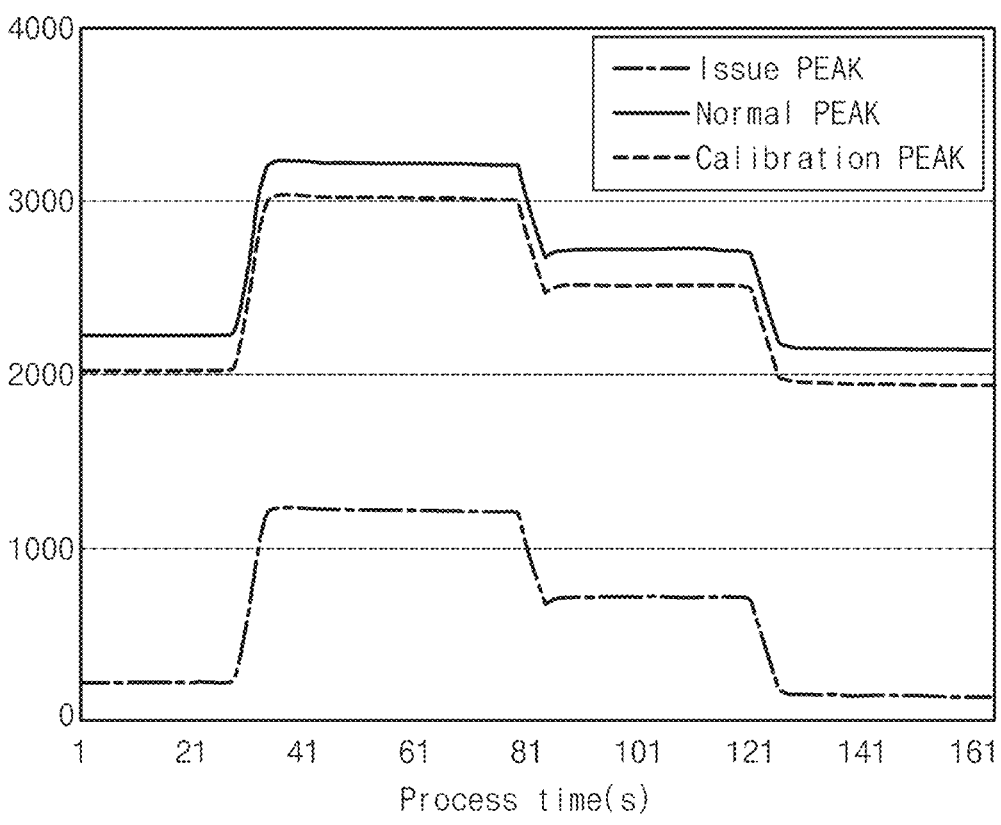
FIG. 6 is a graph showing standardized data, currently detected peak data, and peak data in an abnormal state according to the exemplary embodiment of the present invention.

FIG. 6 is a graph showing standardized data, currently detected peak data, and peak data in an abnormal state according to the exemplary embodiment of the present invention.

Referring to FIG. 6, when current peak data (Issue PEAK, see two-dot chain line) detected by the analysis unit 920 is in an abnormal state, while treating the plasma, the operator may change the fastening length between the optical cable 930 and the light collection unit 910 by using standardized data recorded by collecting peak data according to the fastening length between the optical cable 930 and the light collection unit 910.

For example, when the impurities are deposited in the view port 505 and the current peak data (Issue PEAK) detected by the analysis unit 920 has a lower value than peak data (normal PEAK) in a normal state, the operator may change the fastening length between the connection terminal 932 formed on the optical cable 930 and the light collection unit 910 using the standardized data. Specifically, the operator may change the fastening length between the connection terminal 932 and the light collection unit 910 by using the fastening length (recorded in the standardized data) between the connection terminal 932 and the light collection unit 910 required when the current peak data (Is sue PEAK) reaches the peak data (normal PEAK) in the normal state. Accordingly, the current peak data (Issue PEAK) may be calibrated to peak data (normal PEAK) in the normal state.

In addition, after performing the maintenance on the process chamber 50, the operator may fasten the connection terminal 932 to the light collection unit 910 according to the fastening length required to detect the peak data (normal PEAK) in the normal state, which is the reference, based on the standardized data. However, the present invention is not limited thereto, and after performing the maintenance, the connection terminal 932 is fastened to the light collection unit 910 to have an arbitrary fastening length according to the operator, and while treating the substrate W using plasma, the operator may calibrate the fastening length between the connection terminal 932 and the light collection unit 910 based on the standardized data.

According to the exemplary embodiment of the present invention described above, even if the light amount passing through the view port 505 is reduced by the impurities generated while the substrate W is treated using the plasma, the end point of treating on the substrate W may be accurately detected by changing the fastening length between the optical cable 930 and the light collection unit 910 using the standardized data. In addition, even when the degree of fastening between the optical cable 930 and the light collection unit 910 varies according to the operator after performing the maintenance on the process chamber 50, the end point of treating on the substrate W may be accurately detected using the standardized data.

In the above example, it has been described as an example in which the operator recorded the standardized data, but is not limited thereto. For example, a process controller consisting of a microprocessor (computer) and a controller (not illustrated) consisting of a storage memory, a display, and the like may receive and collect the peak data according to the fastening length detected by the analysis unit 920 to record the collected peak data as the standardized data. The operator may change the fastening length between the optical cable 930 and the light collection unit 910 using the standardized data recorded in the controller (not illustrated).

Hereinafter, another exemplary embodiment of the connection terminal and the measurement member according to the exemplary embodiment of the present invention will be described. Since the connection terminal and the measurement member according to an exemplary embodiment to be described below are substantially the same as or similar to those of the above-described exemplary embodiment except for additional description, descriptions of duplicated contents will be omitted.

Figure 7:
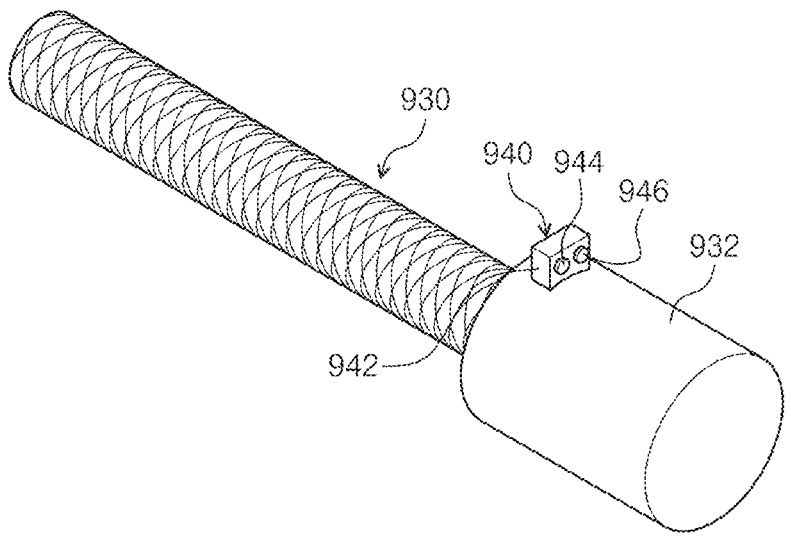
FIG. 7 is a diagram schematically illustrating a connection terminal and a measurement member according to another exemplary embodiment of FIG. 3.
Figure 8:
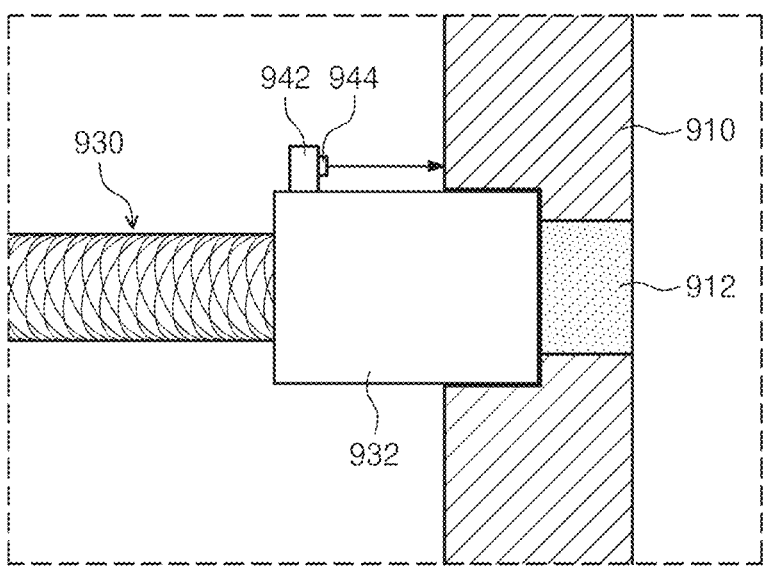
FIG. 8 is a diagram schematically illustrating a state in which a connection terminal is connected to a light collection unit according to the exemplary embodiment of FIG. 7.

FIG. 7 is a diagram schematically illustrating a connection terminal and a measurement member according to another exemplary embodiment of FIG. 3. FIG. 8 is a diagram schematically illustrating a state in which the connection terminal is connected to a light collection unit according to the exemplary embodiment of FIG. 7.

Referring to FIGS. 3, 7, and 8, a measurement member 940 may be disposed at the connection terminal 932 according to an exemplary embodiment of the present invention. The measurement member 940 according to the exemplary embodiment may measure a fastening length between the light collection unit 910 and the optical cable. The measurement member 940 may include distance sensors 944 and 946. The distance sensors 944 and 946 according to the exemplary embodiment may be provided on one side of the connection terminal 932. For example, as illustrated in FIG. 6, a protrusion member 942 may be provided on one side surface of the connection terminal 932. The protrusion member 942 may be provided to protrude from one side surface of the connection terminal 932. For example, when the connection terminal 932 is completely fastened to the groove formed in the light collection unit 910, the protrusion member 942 may be located outside the groove formed in the light collection unit 910.

The distance sensors 944 and 946 may be provided on side surfaces of the protrusion member 942. The distance sensors 944 and 946 may be provided on a side surface facing the light collection unit 910 among side surfaces of the protrusion member 942. The distance sensors 944 and 946 may be configured by an irradiator 944 that irradiates infrared rays, ultraviolet rays, ultrasonic waves, visible rays, or laser, and a receiver 946 that receives the irradiated infrared rays, ultraviolet rays, ultrasonic waves, visible rays, or laser. The distance sensors 944 and 946 may measure a distance to the light collection unit 910 to which the connection terminal 932 is connected by irradiating infrared rays and the like toward the light collection unit 910 and receiving the irradiated infrared rays. The fastening length between the light collection unit 910 and the optical cable 930 may be measured by using the distance measured by the distance sensors 944 and 946.

The foregoing detailed description illustrates the present invention. Further, the aforementioned contents show and describe the preferred exemplary embodiment of the present invention, and the present invention can be used in various other combinations, modifications, and environments. That is, the foregoing contents may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus for treating a substrate comprising:
    a chamber including a treating space and configured to generate plasma in the treating space and treat a substrate using the plasma; and
    a measurement unit configured to monitor light emitted from the plasma of the treating space,
    wherein the measurement unit comprises
        a light collection unit configured to collect the light passing through a view port defined on one side wall of the chamber, the light collection unit including a collection terminal and a groove, the collection terminal at on inner wall of the light collection unit and the groove defined by an outer wall of the light collection unit, the collection terminal and the groove overlapping each other when viewed from a front, and
        an optical cable having a connection terminal at one end thereof and configured to transmit the light, a partial region of the connection terminal fastened to the groove of the light collection unit, and
      wherein a measurement member capable of measuring a fastening length between the light collection unit and the optical cable is in the connection terminal.

2. The substrate treating apparatus of claim 1, wherein the measurement member includes a scale indicated along a longitudinal direction of the optical cable.

3. The substrate treating apparatus of claim 2, wherein the measurement unit further includes an analysis unit, the analysis unit being connected to the other end of the optical cable and configured to to analyze the light transmitted from the light collection unit and analyze peak data of the light to detect an end point of the treating.

4. The substrate treating apparatus of claim 3, wherein the substrate treating apparatus is configured to change the peak data according to the fastening length.

5. The substrate treating apparatus of claim 4, wherein the substrate treating apparatus is configured so that the fastening length and the peak data are proportional to each other.

6. The substrate treating apparatus of claim 5, wherein the substrate treating apparatus is configured to allow an operator to collect the peak data according to the fastening length and record the collected peak data as standardized data while performing the treating.

7. The substrate treating apparatus of claim 6, wherein the substrate treating apparatus is further configured to allow the operator to change the fastening length so that the collected peak data is calibrated as normal peak data in a normal state based on the standardized data.

8. The substrate treating apparatus of claim 2, wherein the connection terminal has a same longitudinal direction as the longitudinal direction of the optical cable and is fastened to one wall of the light collection unit, and the scale is indicated from one end to the other end of the connection terminal.

9. The substrate treating apparatus of claim 1, wherein measurement member includes a distance sensor, the distance sensor being on one side of the connection terminal and configured to measure a distance to the light collection unit to which the connection terminal is connected.

10. The substrate treating apparatus of claim 1, wherein the chamber further comprises
    a support unit configured to support the substrate in the treating space;
    a gas supply unit configured to supply gas to the treating space; and
    a plasma source configured to excite the gas.

11. A substrate treating apparatus for treating a substrate comprising:
    a chamber having a view port and a treating space therein;
    a support unit configured to support the substrate in the treating space;
    a gas supply unit configured to supply gas to the treating space;
    a plasma source configured to generate plasma by exciting the gas in the treating space and treat the substrate using the plasma; and
    a measurement unit configured to monitor light emitting from the plasma,
    wherein the measurement unit comprises
        a light collection unit configured to collect the light passing through the view; port defined on one side wall of the chamber, the light collection unit including a collection terminal and a groove, the collection terminal at on inner wall of the light collection unit and the groove defined by an outer wall of the light collection unit, the collection terminal and the groove overlapping each other when viewed from a front,
        an analysis unit configured to detect an end point of the treating of the substrate by analyzing peak data of the light transmitted from the light collection unit,
        an optical cable connected to the light collection unit and the analysis unit and configured to transmit the light from the light collection unit to the analysis unit,
        a connection terminal at one end of the optical cable, a partial region of the connection terminal fastened to the groove of the light collection unit, and
        a measurement member capable of measuring a fastening length between the light collection unit and the optical cable is in the connection terminal.

12. The substrate treating apparatus of claim 11, wherein the measurement member includes a scale indicated on the connection terminal along a longitudinal direction of the connection terminal, and
    the connection terminal is fastened to one side wall of the light collection unit.

13. The substrate treating apparatus of claim 12, wherein the substrate treating apparatus is configured to
    change the peak data according to the fastening length, and
    allow an operator to
      collect the peak data according to the fastening length and record the collected peak data as standardized data while performing the treating, and
      to change the fastening length so that the collected peak data is calibrated as normal peak data in a normal state based on the standardized data.

\* \* \* \* \*